(12) United States Patent
Kim et al.

(10) Patent No.: US 8,048,737 B2
(45) Date of Patent: Nov. 1, 2011

(54) SEMICONDUCTOR DEVICE AND METHOD OF FABRICATING THE SAME

(75) Inventors: Do Hyung Kim, Seoul (KR); Young Man Cho, Icheon (KR)

(73) Assignee: Hynix Semiconductor, Inc., Icheon (KR)

( * ) Notice: Subject to any disclaimer, the term of this patent is extended or adjusted under 35 U.S.C. 154(b) by 74 days.

(21) Appl. No.: 12/648,710

(22) Filed: Dec. 29, 2009

(65) Prior Publication Data

US 2011/0037111 A1    Feb. 17, 2011

(30) Foreign Application Priority Data

Aug. 11, 2009   (KR) .................. 10-2009-0073818

(51) Int. Cl.
*H01L 27/108* (2006.01)
(52) U.S. Cl. ............. 438/253; 257/302; 257/E27.091; 257/E21.646
(58) Field of Classification Search .......... 438/253; 257/302
See application file for complete search history.

(56) References Cited

U.S. PATENT DOCUMENTS

| | | | |
|---|---|---|---|
| 5,398,205 A * | 3/1995 | Yamaguchi | 365/149 |
| 6,720,606 B1 * | 4/2004 | Nitayama et al. | 257/306 |
| 7,034,408 B1 | 4/2006 | Schloesser | |
| 2002/0195680 A1 * | 12/2002 | Son | 257/510 |
| 2004/0224476 A1 * | 11/2004 | Yamada et al. | 438/400 |
| 2007/0267676 A1 * | 11/2007 | Kim et al. | 257/311 |
| 2008/0017904 A1 * | 1/2008 | Akiyama et al. | 257/300 |
| 2008/0284029 A1 * | 11/2008 | Kim et al. | 257/758 |
| 2011/0070716 A1 * | 3/2011 | Kim | 438/386 |

FOREIGN PATENT DOCUMENTS

KR    20040069515 A    8/2004
KR    20040079518 A    9/2004

* cited by examiner

*Primary Examiner* — A. Sefer

(57) ABSTRACT

The invention relates to a semiconductor device and a method of fabricating the same, wherein a storage node contact hole is made large to solve any problem caused during etching a storage node contact hole with a small CD, a landing plug is formed to lower plug resistance, and the SAC process is eliminated at the time of the bit line formation. A method of fabricating a semiconductor device according to the invention comprises: forming a device isolation film for defining a multiplicity of active regions in a semiconductor substrate; forming a multiplicity of buried word lines in the semiconductor substrate; forming a storage node contact hole for exposing a storage node contact region of two adjoining active regions; filling the storage node contact hole with a storage node contact plug material; forming a bit-line groove for exposing a bit-line contact region of the active region and splitting the storage node contact plug material into two; and burying the bit line into the bit-line groove.

11 Claims, 13 Drawing Sheets

(a)

(b)

(a)

(b)

(a)

(b)

(a)

(b)

(a)

(b)

(a)

(b)

(a)

(b)

US 8,048,737 B2

SEMICONDUCTOR DEVICE AND METHOD OF FABRICATING THE SAME

CROSS-REFERENCE TO RELATED APPLICATION

The present application claims priority to Korean patent application number 10-2009-0073818, filed on 11 Aug. 2009, which is incorporated by reference in its entirety.

BACKGROUND OF THE INVENTION

The present invention relates to a semiconductor device and a method of fabricating the same; more particularly, to a semiconductor device including a buried gate, a storage node and bit lines and a method of fabricating the same.

In semiconductor memory devices, DRAM has a multiplicity of unit cells, each consisting of a capacitor and a transistor. Among them, the capacitor is used to store data temporarily, and the transistor is used to transmit data between a bit line and the capacitor in response to a control signal (word line), while using the nature of a semiconductor having variable conductivity. The transistor has a gate, a source and a drain. According to a control signal applied to the gate, the charged particles are allowed to move between the source and the drain. The movement of charged particles between the source and the drain is realized via a channel region defined by the gate.

According to a method of fabricating a conventional transistor on a semiconductor substrate, a gate is first formed over the semiconductor substrate and impurities are doped into two sides of the gate to form a source and a drain. A region between the source and drain under the gate becomes a channel region for the transistor. The transistor having such a horizontal channel region occupies a certain area of the semiconductor substrate. A high density semiconductor memory device has numerous transistors formed therein so it is difficult to reduce the size of the semiconductor memory device (or the chip size).

Decreasing the chip size allows a larger number of semiconductor memory chips to be produced per wafer, leading to an improved yield. Indeed, a number of different techniques have been used to reduce the chip size. One technique is to use a recess gate instead of a traditional planar gate having a horizontal channel region, where a recess is formed on the substrate and then forming a gate in that recess so as to obtain a channel region along the curved surface of the recess. Another technique uses a buried gate that is formed by burying the entire gate within the recess.

In such a buried gate structure, an isolation gate has been used to form a bit-line contact as well as a storage node contact in a line type. However, in doing so, the cell area may become larger than the isolation gate structure and may experience a greater leakage current than for the existing trench-type device isolation film.

Also, a buried gate structure using such a trench-type device isolation film has a disadvantage in that during the patterning of a bit-line contact, a contact hole is generally require to be patterned as a hole by dry etching. If a Critical Dimension (CD) becomes smaller in size, the contact hole pattern may not be defined on a mask. Moreover, when the contact hole needs to be etched in an active region during a subsequent etching process, the active region may not open. Increasing the CD to prevent this may cause a short problem with the storage node.

Besides, there are other problems: for example, the storage node contact has to be formed as a Self Aligned Contact (SAC) after the formation of bit lines, and a reduced contact area between the active regions and the contact increases contact resistance.

BRIEF SUMMARY OF THE INVENTION

Embodiments of the present invention are directed to providing a semiconductor device and a method of fabricating the same, wherein a storage node contact hole is made sufficiently large to facilitate the etching of a storage node contact hole with a small CD. Also, a landing plug is formed to have resistance that is lower than the plug resistance, and the SAC process is performed at the time of the bit line formation.

In one embodiment, a method of fabricating a semiconductor device, includes forming a device isolation film for defining a multiplicity of active regions in a semiconductor substrate; forming a multiplicity of buried word lines in the semiconductor substrate; forming a storage node contact hole for exposing a storage node contact region of two adjoining active regions; filling the storage node contact hole with a storage node contact plug material; forming a bit-line groove for exposing a bit-line contact region of the active region and splitting the storage node contact plug material into two; and forming a bit line into the bit-line groove. By making the storage node contact hole large, any problem caused during the etching of a storage node contact hole with a small CD can be solved, and the SAC process is no longer needed during the formation of bit lines.

The method of fabricating a semiconductor device further comprises: forming a landing plug over the bit-line contact region and storage node contact region of the active region.

The formation of the landing plug preferably comprises: before the formation of the word lines, forming a hard mask oxide and a hard mask layer over the surface of the active region; after the formation of the word lines, removing the hard mask layer and the hard mask oxide from the surface of the active region; forming a landing plug in a space of the active region from which the hard mask layer has been removed; and implanting ions into the landing plug.

The formation of the storage node contact hole preferably comprises: forming an interlayer dielectric over the semiconductor substrate including the landing plug and the word lines; and etching the interlayer dielectric with the landing plug as an etch stop layer.

The method further comprises: forming a selective epi growth (SEG) layer in the bit-line contact and storage node contact regions of the active region, so as to increase the height of a junction region (source/drain) of the active region by SEG layer to lower plug resistance and to reduce GIDL (Gate Induced Drain Leakage).

The formation of the buried word lines comprises: forming a trench in the semiconductor substrate; filling the trench with a gate conductive layer; and forming a capping layer over the gate conductive layer within the trench. In this manner, buried word lines are formed on the lower portion of the surface of the silicon substrate.

The method preferably further comprises: after the formation of the bit-line groove, forming a nitride spacer on the side walls of the bit-line groove.

Preferably, the formation of the bit lines is performed by the damascene process comprising: forming a barrier metal layer on the side walls and bottom surface of the bit-line groove; and forming a bit-line conductive layer over the surface of the barrier metal layer.

The method preferably further comprises: after the formation of the barrier metal layer, thermally oxidizing the barrier metal layer to form silicide; and removing the barrier metal layer to leave the silicide.

The surface of the landing plug has preferably the same height with the surface of the device isolation film.

The present invention method of fabricating a semiconductor device comprised of: active regions formed over a semiconductor substrate, each active region including a bit-line contact region and a storage node contact region, and a device isolation film for defining the active regions; a multiplicity of word lines buried in the semiconductor substrate; a storage node contact plug buried in a storage node contact hole that exposes the storage node contact region of the two adjoining active regions; a bit-line groove for exposing the bit-line contact region of the active region and splitting the storage node contact plug material into two; and bit lines buried in the bit-line groove, is characterized in that any problem caused during the etching of a storage node contact hole with a small CD can be solved by making the storage node contact hole large and that the SAC process is not required at the time of the formation of bit lines.

With the semiconductor device further comprising a polysilicon plug formed over the bit-line contact and storage node contact regions of the active region, plug resistance can be lowered.

With the semiconductor device further comprising a selective epi growth layer over the bit-line contact and storage node contact regions of the active region, the height of the junction region (source/drain) of the active region can be increased by the SEG layer, and this in turn lowers plug resistance and reduces GIDL.

The semiconductor device preferably further comprises an interlayer dielectric formed over the word lines and device isolation film, and the word line is formed of a buried word line comprising: a gate conductive layer buried in a trench of the semiconductor substrate; and a capping layer formed over the gate conductive layer within the trench.

The semiconductor device preferably further comprises a nitride spacer formed on the side walls of the bit-line groove, and the bit lines are formed by the damascene process comprising: forming a barrier metal layer on the side walls and bottom surface of the bit-line groove; and forming a bit-line conductive layer over the surface of the barrier metal layer.

The semiconductor device preferably further comprises silicide formed between the barrier metal layer and the bit-line conductive layer, and the surface of the landing plug has the same height as the surface of the device isolation film.

DESCRIPTION OF EMBODIMENTS

Embodiments of a method of fabricating a semiconductor device according to the present invention will now be described in greater detail with reference to the accompanying drawings.

FIG. 1 to FIG. 13 are plan or sectional views sequentially illustrating a fabrication method of a semiconductor device according to the present invention. In FIG. 2, (a) is a sectional view taken along the Y direction in FIG. 1, (b) is a sectional view taken along the X direction in FIG. 1. Other figures follow the same orientations.

Figure 1:
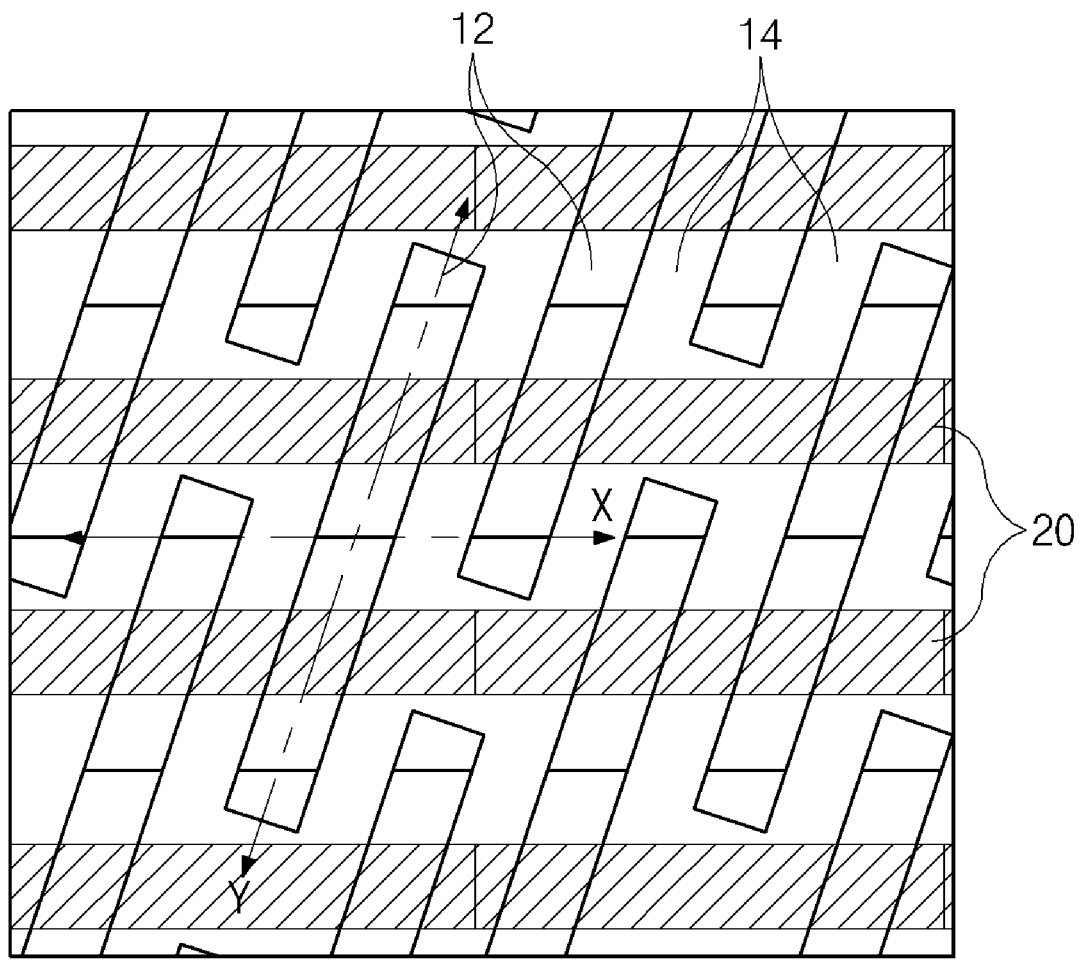
FIG. 1 to FIG. 13 are plan or sectional views sequentially illustrating a fabrication method of a semiconductor device according to the present invention.
Figure 2:
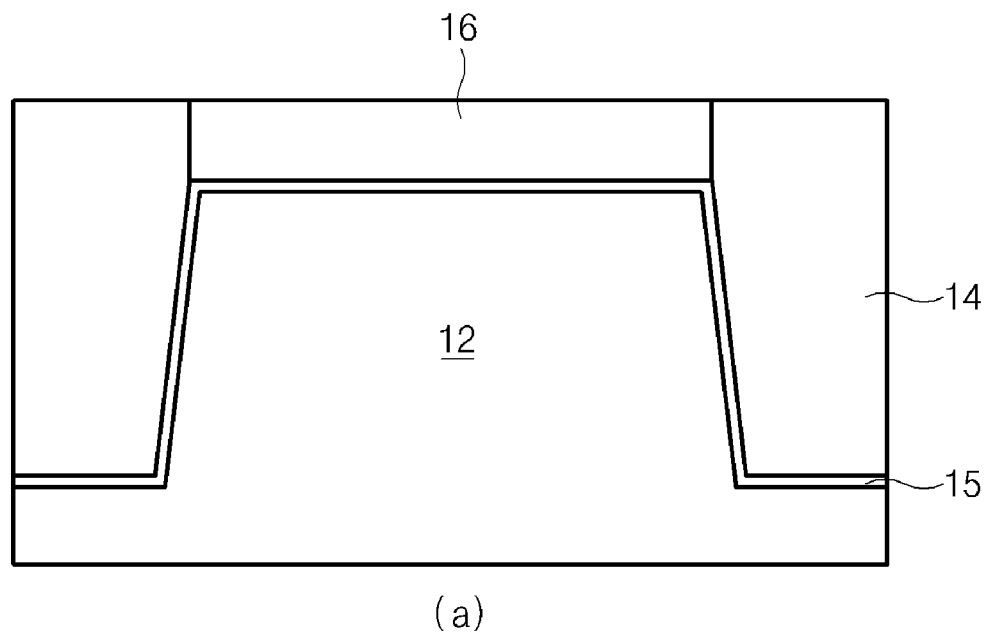
Figure 2:
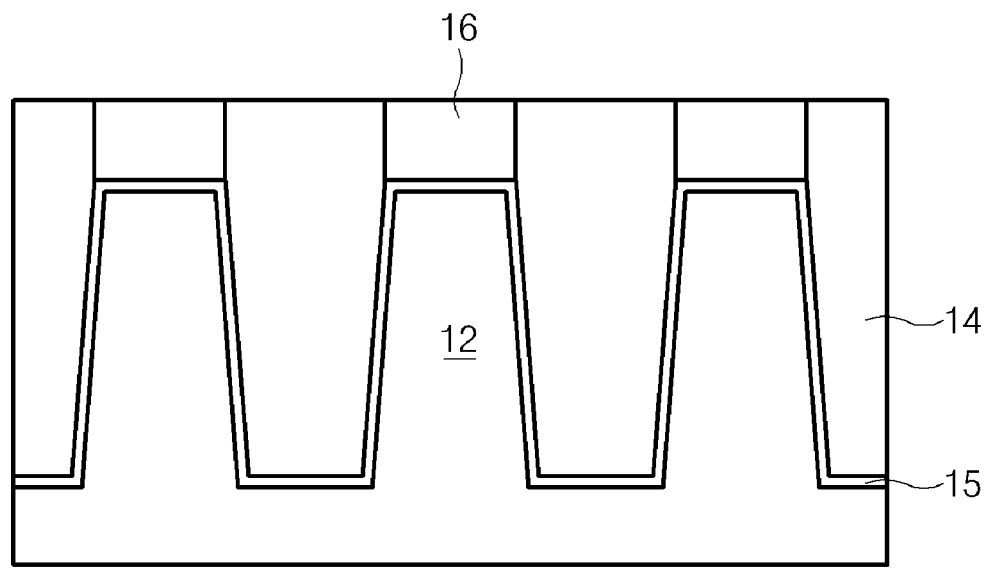

Referring first to FIG. 1, active regions 12 and device isolation films 14 for defining the active regions 12 are formed over a semiconductor substrate. Each active region 12 is intersected by two word lines 20. The active region defines an acute angle with respect to the word line 20 in the present embodiment. The word line 20 is formed within the semiconductor substrate as a buried word line, i.e., the upper surface of the word line 20 is lower than the upper surface of the semiconductor substrate.

Referring to FIG. 2, a hard mask oxide 15 and a nitride or a hard mask layer made of a polysilicon material are sequentially formed over the surface of the semiconductor substrate. The hard mask layer is etched using a mask that defines a device isolation film 14 region to form a hard mask pattern 16. The semiconductor substrate is etched using this hard mask pattern 16 as a mask to form a trench therein, and the trench is filled with an oxide to form the device isolation film 14.

In one embodiment, a liner nitride (not shown) and a liner oxide (not shown) are formed over the trench surface of the semiconductor substrate before the device isolation film 14 is formed thereon. The device isolation film 14 made of an oxide material is obtained by forming an oxide, e.g., using a Spin On Dielectric (SOD) method, over the entire surface of the semiconductor substrate having a trench formed therein and then removing the oxide from the surface of the hard mask pattern 16 by the CMP method to fill the device isolation film 14 into the trench.

In a conventional method, the active regions 12 were formed to have their surfaces to be the same height as the surface of the device isolation film 14. In the present embodiment, since the hard mask 16 resides on the surface of the active regions 12, the surface of the hard mask 16 is formed to have the same height as the surface of the device isolation film 14, i.e., the upper surface of the active region 12 is provided to be lower than the upper surface of the device isolation 14. This height difference between the active region 12 and the device isolation 14 facilitates the formation of a landing plug because interlayer dielectric need not be formed over the active region 12 when the hard mask pattern 16 is made of a nitride and then the nitride material is removed, or when the hard mask 16 is made of polysilicon and then the polysilicon is patterned to be used as a landing plug. In another embodiment of the present invention, instead of forming the hard mask 16 over the active region 12, a selective epi growth (SEG) process is performed on the active region to make the surface of an SEG layer (not shown) of the active region 12 to have substantially the same height as the surface of the device isolation film 14. In this case, although a storage node contact is formed directly on the surface of the SEG layer (not shown) over the active region 12 without forming a landing plug, since the SEG layer increases the height of a junction region (source/drain) of the active region 12, plug resistance can be lowered and Gate Induced Drain Leakage (GIDL) is reduced.

Figure 3:
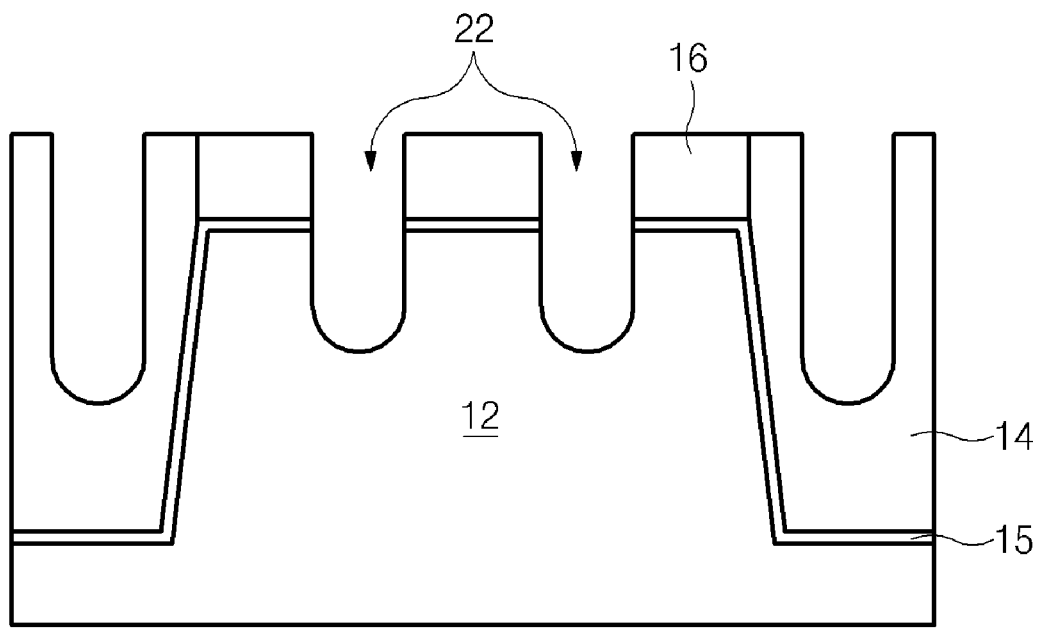
Figure 3:
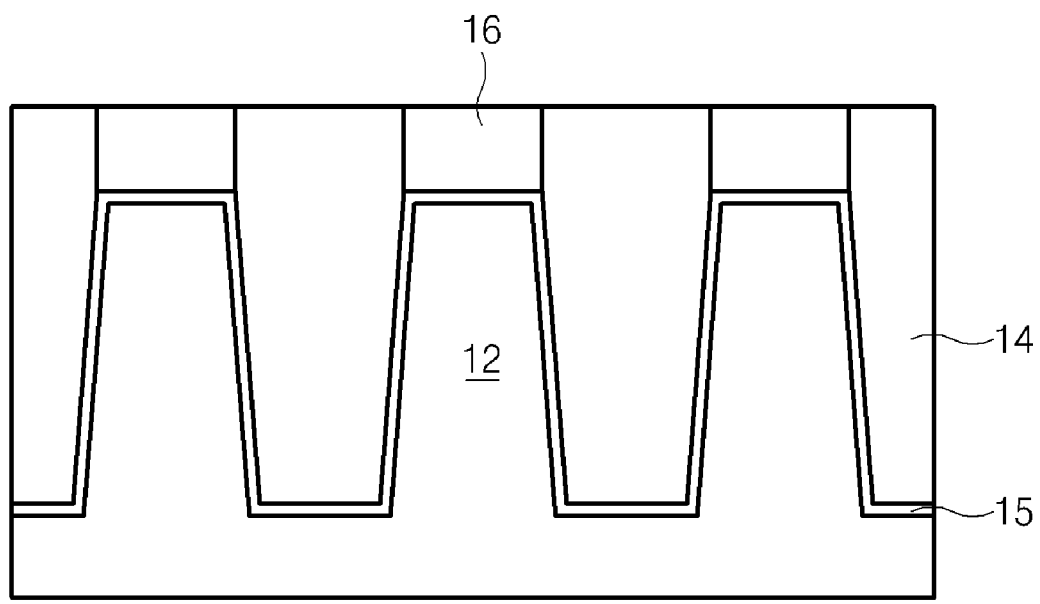
Figure 4:
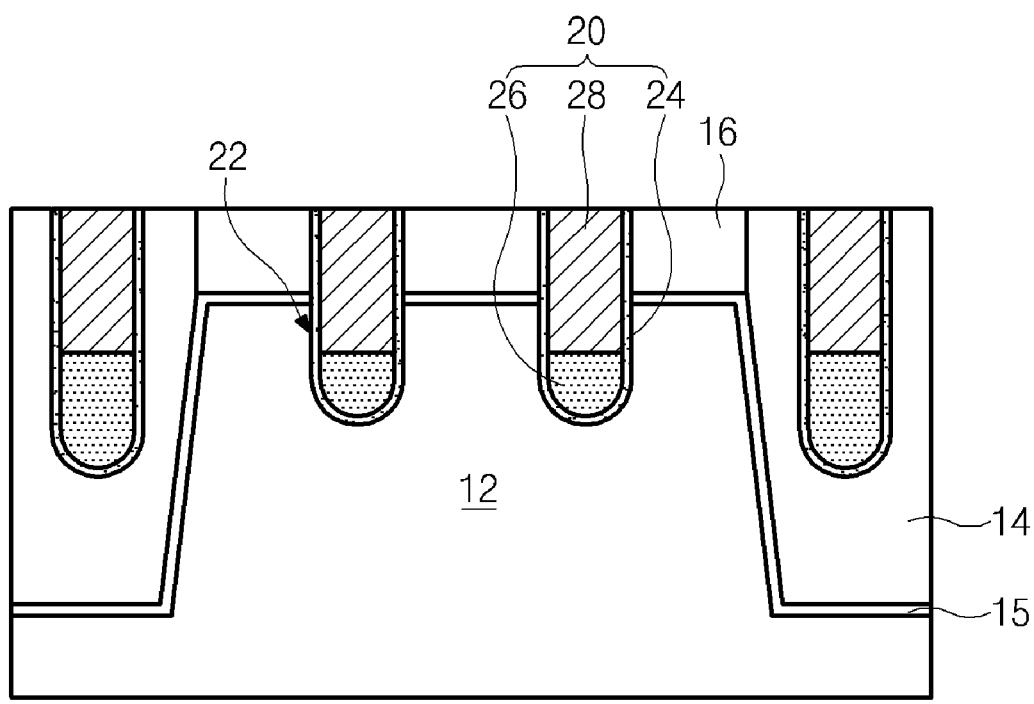
Figure 4:
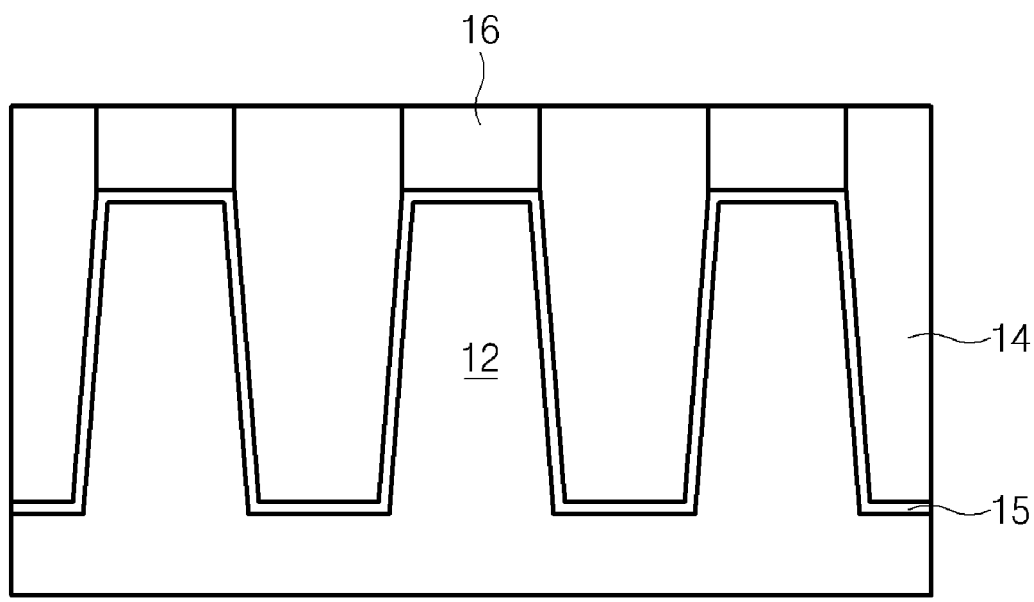

Referring to FIG. 3, a trench 22 having a predetermined depth for forming a buried gate 20 is formed in the semiconductor substrate having the active regions 12 and the device isolation films 14 formed thereon. The surface of the trench 22 is oxidized to form a gate oxide 24, and the trench 22 having the gate oxide 24 formed thereon is filled with a gate electrode 26 (FIG. 4). The gate electrode 26 includes TiN and tungsten (W) in the present embodiment. A capping film 28 for protecting the gate electrode 26 is formed over the gate electrode 26 within the trench 22.

Figure 5:
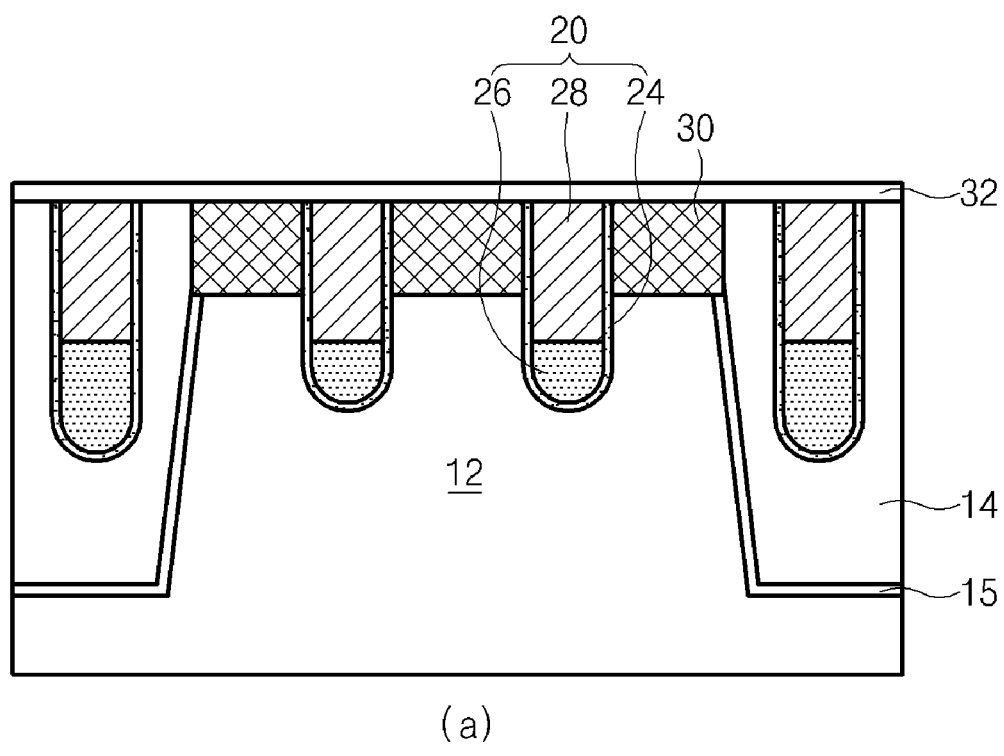
Figure 5:
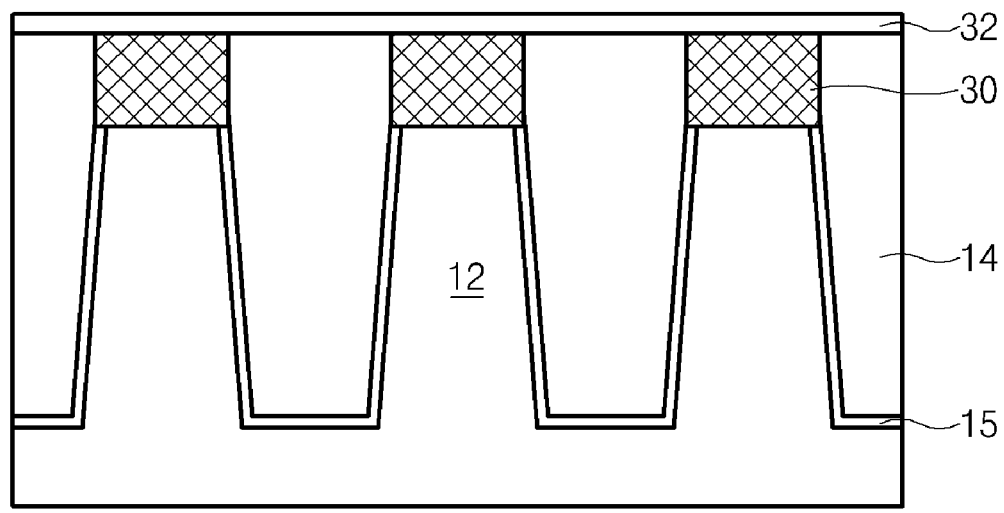

Referring to FIG. 5, the hard mask layer 16 is removed and a landing plug 30 is formed in a space created by removing the hard mask layer 16. The landing plug 30 electrically connects the junction region (source/drain) of the semiconductor substrate to the bit-line contact plug and the storage node contact plug. The landing plug 20 is formed of conductive material (e.g., polysilicon). The landing plug formation process includes depositing a landing plug material such as polysilicon within the space created by the removal of the hard mask layer 16 and over the capping film 28. Excess landing plug material that protrudes above the capping film 28 is removed using chemical mechanical polishing (CMP) or etch-back. The landing plug 30 can be formed by depositing doped polysilicon, or by depositing polysilicon and then implanting ions for doping.

Rather than forming a bit-line contact plug and a storage node contact plug directly on the junction region of the semiconductor substrate, the landing plug 30 on the junction region of the semiconductor substrate since bit lines are to be formed by the damascene process (to be described) in the present embodiment. The landing plug 30 (or an SEG layer grown on the active region 12) couples the bit lines and the junction regions of the active region 12. By the use of landing plug 30, loss of the semiconductor substrate can be avoided during the damascene process used to form the bit lines. As a result, a junction region having a low depth can be utilized. In addition, since a metal plug is not formed directly on the active region, the landing plug 30 serves as a buffer, and the contact surface between the active regions 12 and the contact plug (landing plug) is increased, thereby lowering plug resistance.

A sealing nitride 32 is formed over the landing plug 30, buried gate 20 and device isolation film 14 to protect the buried gate 20 and the landing plug 30. A gate is formed in a peripheral region (not shown), not in the cell region that has been described thus far.

Figure 6:
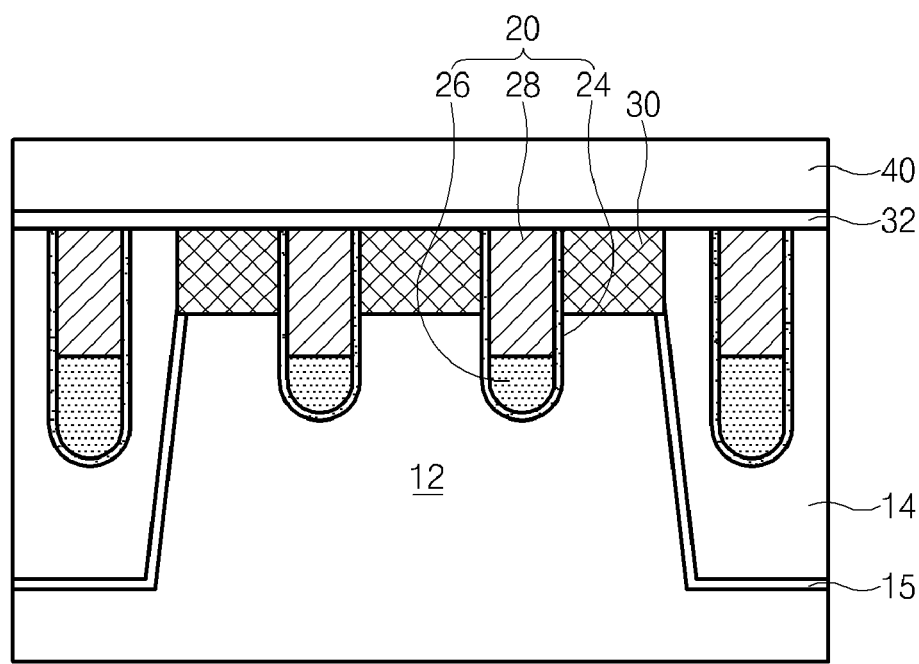
Figure 6:
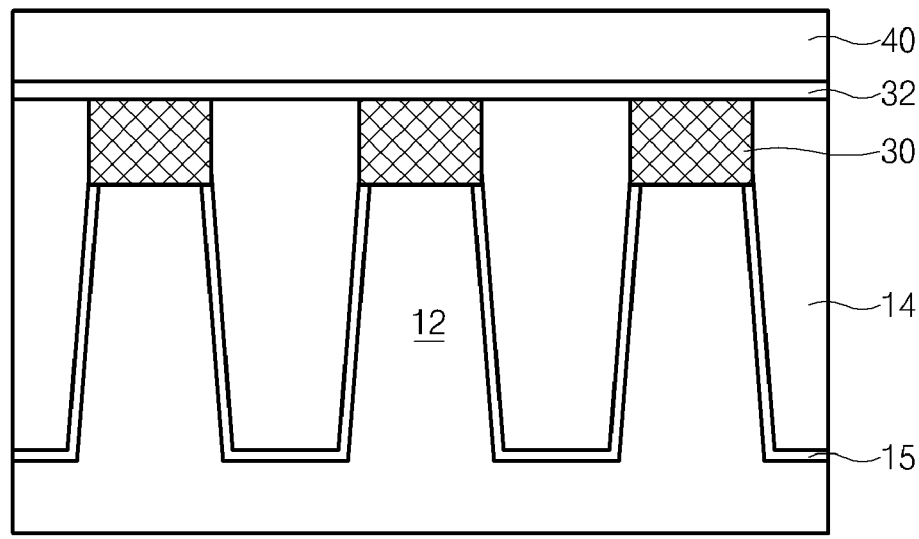

Referring to FIG. 6, an interlayer dielectric (ILD) 40 is formed over the sealing nitride 32.

Figure 7:
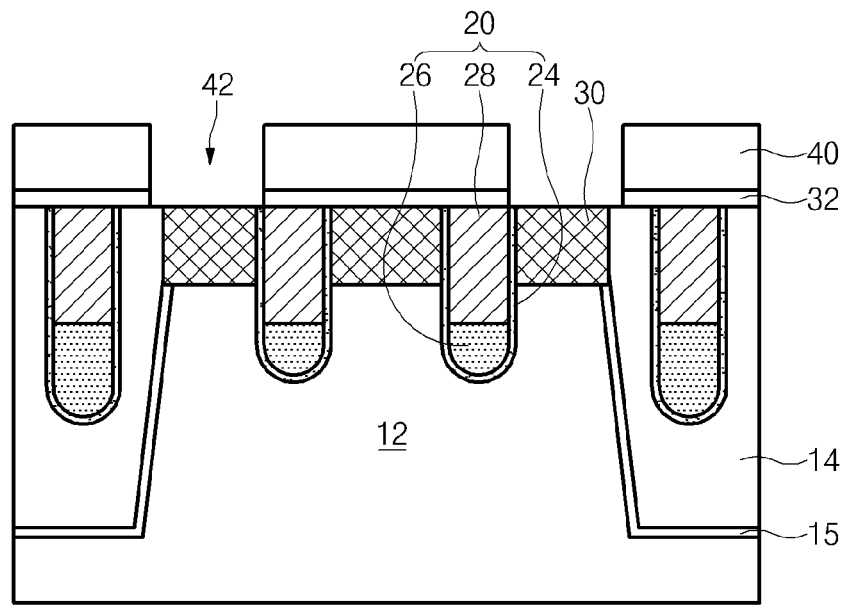
Figure 7:
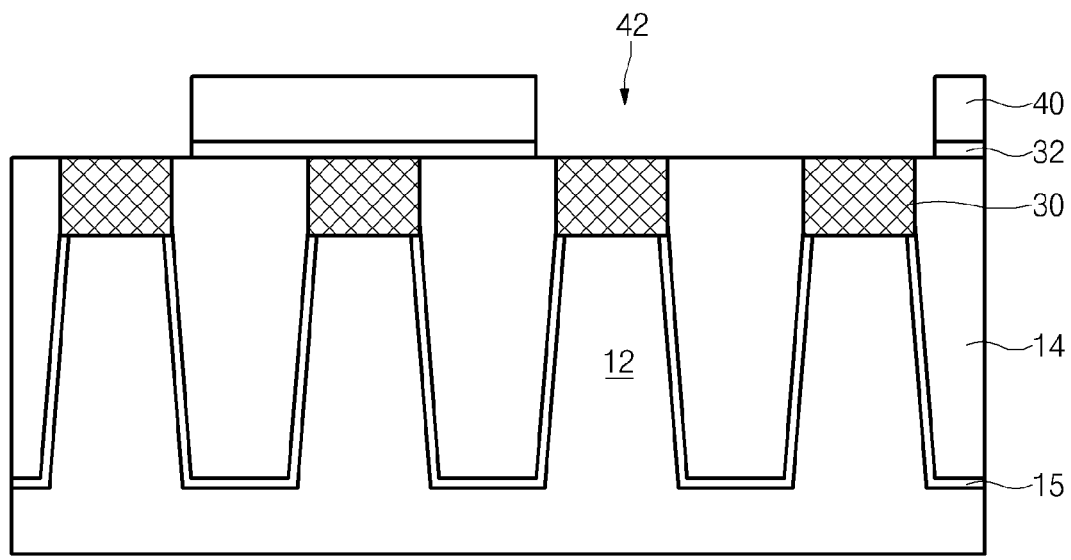
Figure 8:
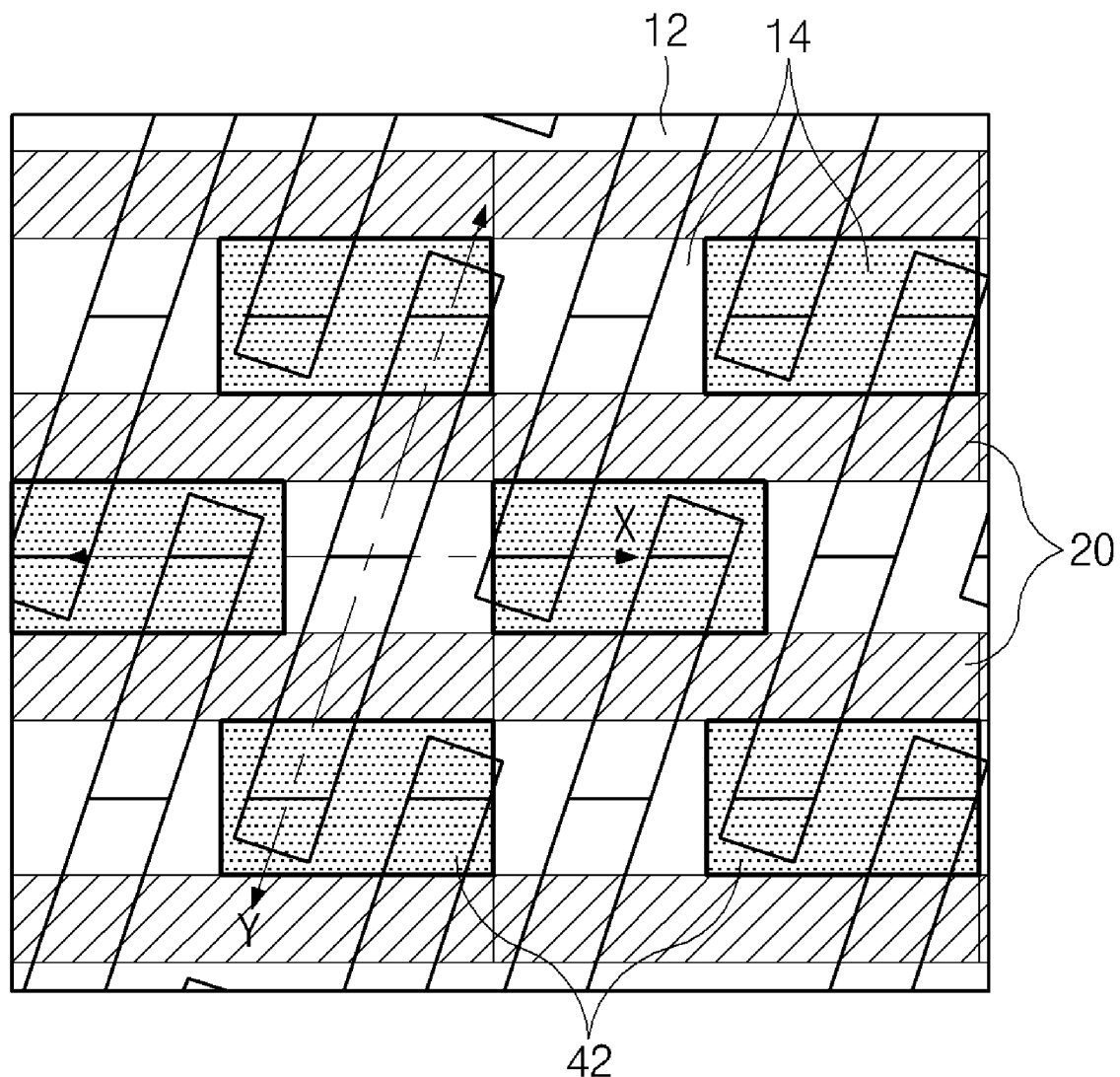

A portion of the ILD 40 is etched to form a storage node contact hole 42 (FIG. 7). Hole 42 exposes the landing plug 30 and is used to form a storage node contact plug. FIG. 7(b) shows a cross sectional view along the X direction of the semiconductor device of FIG. 8. The storage node contact hole 42 includes a storage node region of two adjacent active regions 12 in the present embodiment.

In a conventional method, a storage node contact hole 42 of each active region 12 is formed individually, i.e., one contact hole for each active region. In the present embodiment, one storage node contact hole 42 is formed for two adjacent active regions 12. As a result, a bigger contact hole pattern may be used for the contact hole. The occurrence of a contact hole pattern not being defined on the mask produced during the formation of a contact hole pattern may be minimized. The storage node contact hole pattern including two storage node contact regions is split into two to electrically isolate the two, the process of which is described later.

In the present embodiment, a storage node contact plug is formed before a bit line contact plug so that the bit line formation process may proceed in a similar way with the buried gate formation process.

Figure 9:
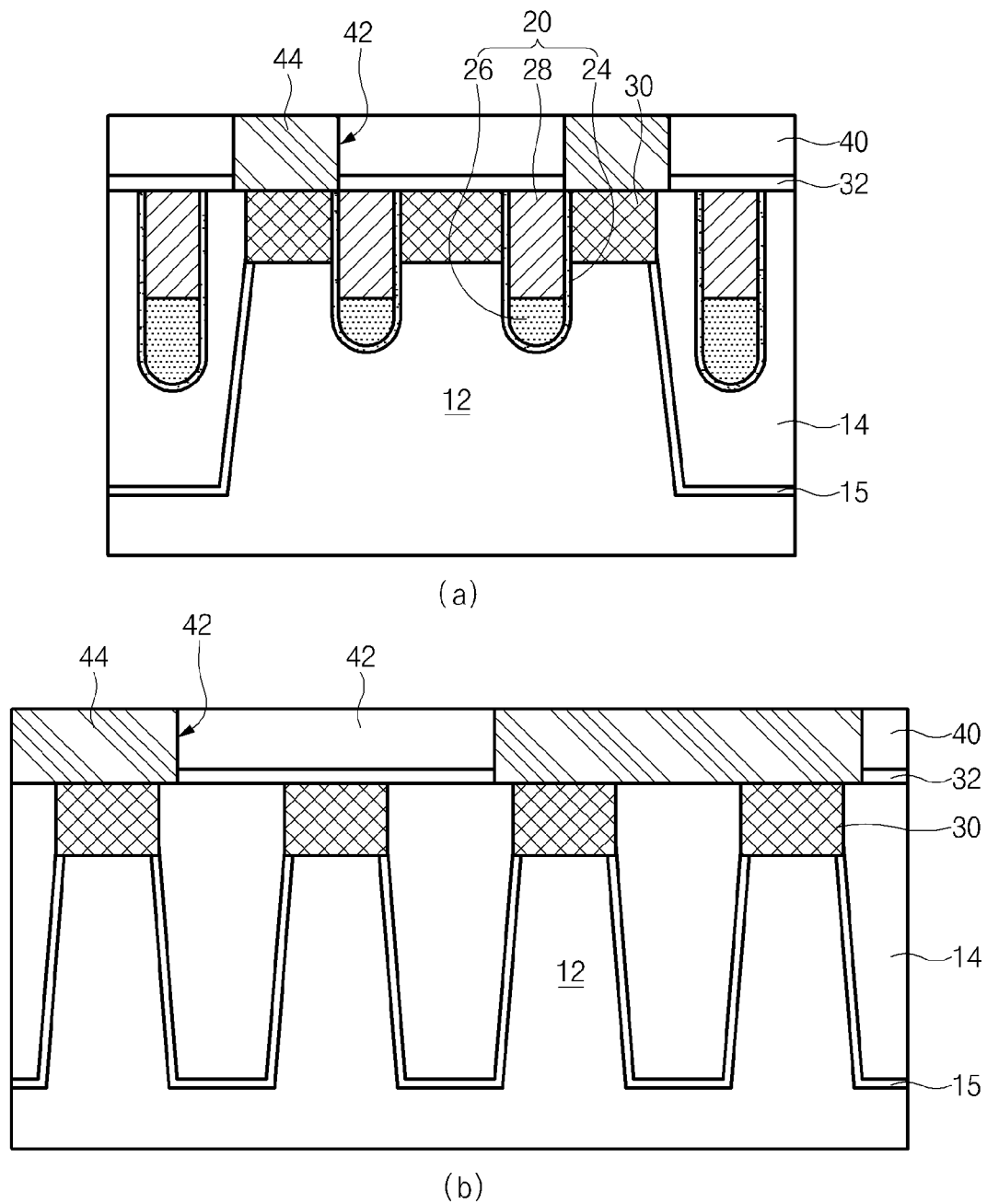

Referring to FIG. 9, the storage node contact hole 42 exposing the landing plug 30 is filled with a conductive material to form a storage node contact plug 44. This storage node contact plug 44 is made of the same material as the landing plug 30 (e.g., polysilicon) in the present embodiment. For example, after a polysilicon layer is deposited on the entire surface of the semiconductor substrate having the storage node contact hole 42 formed therein, the polysilicon layer on the upper portion of the surface of the interlayer dielectric 40 is removed by CMP or etch-back.

Figure 10:
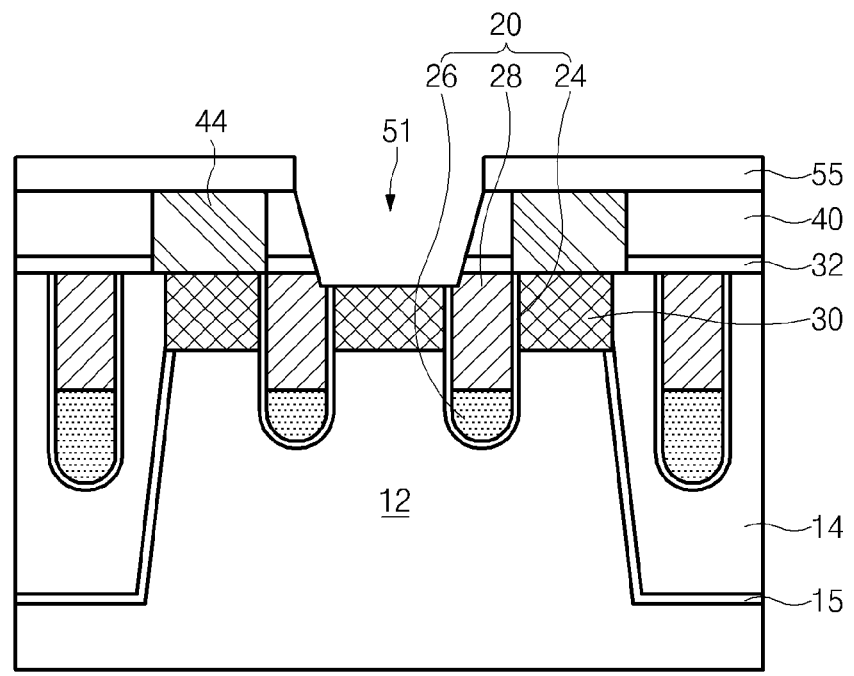
Figure 10:
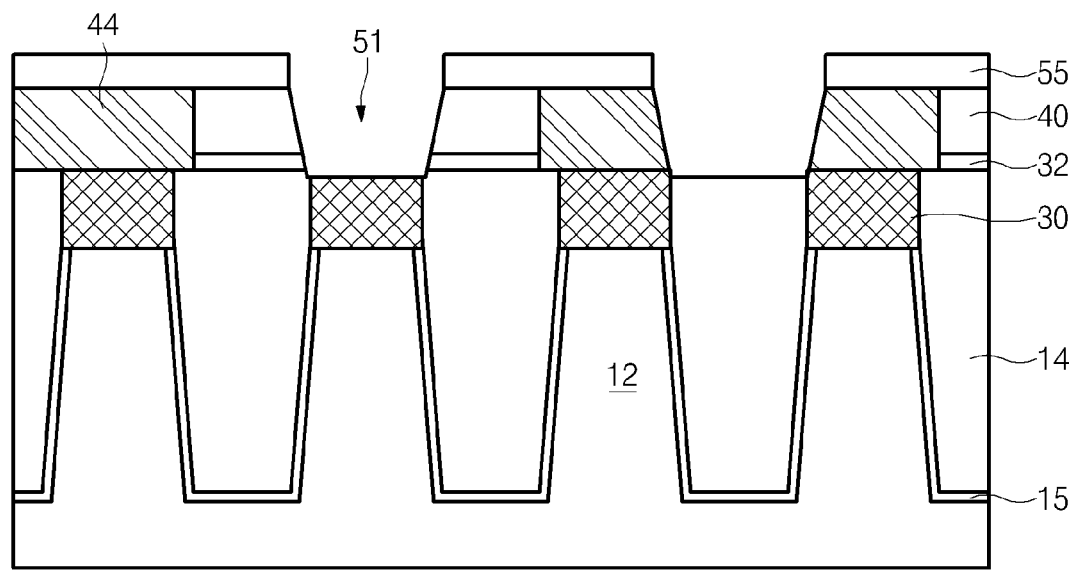

Referring to FIG. 10, a hard mask pattern 55 is formed to define a bit line region over the interlayer dielectric 40 having the storage node contact plug 44 formed therein. The hard mask pattern 55 may be a nitride.

With the hard mask pattern 55 as a mask, a bit-line groove 51 for forming bit lines is etched to a predetermined depth so as to expose the surface of the landing plug 30 in a portion of the bit line region.

The bit-line groove 51 is used to form bit lines by a damascene process. The bit-line groove 51 formed also splits the storage node contact plug 44 (see FIG. 10 (b)) that extends across two adjacent active regions 12 into two separate pieces, where each separated piece connecting the respective active region 12. As a result, the SAC process does not need to be used at the time of the formation of a bit-line contact hole and a storage node contact hole.

Figure 11:
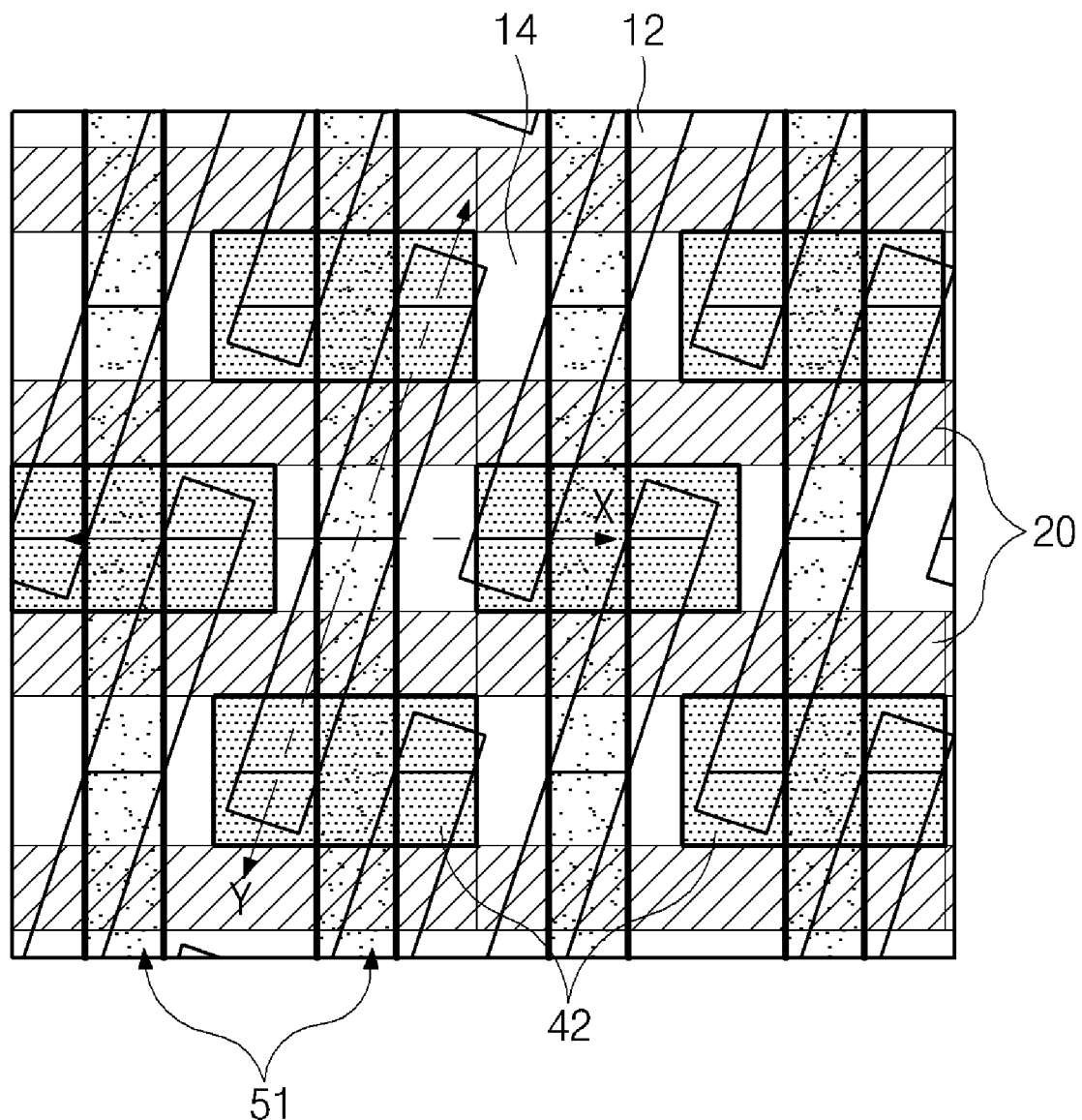

As shown in FIG. 11, as the storage node contact plug 44 is formed in each of a multiplicity of active regions 12, bit lines are also formed in an intersecting manner with those active regions 12. Therefore, by forming a bit-line groove 51, one storage node contact plug 44 formed over two active regions can be split.

Figure 12:
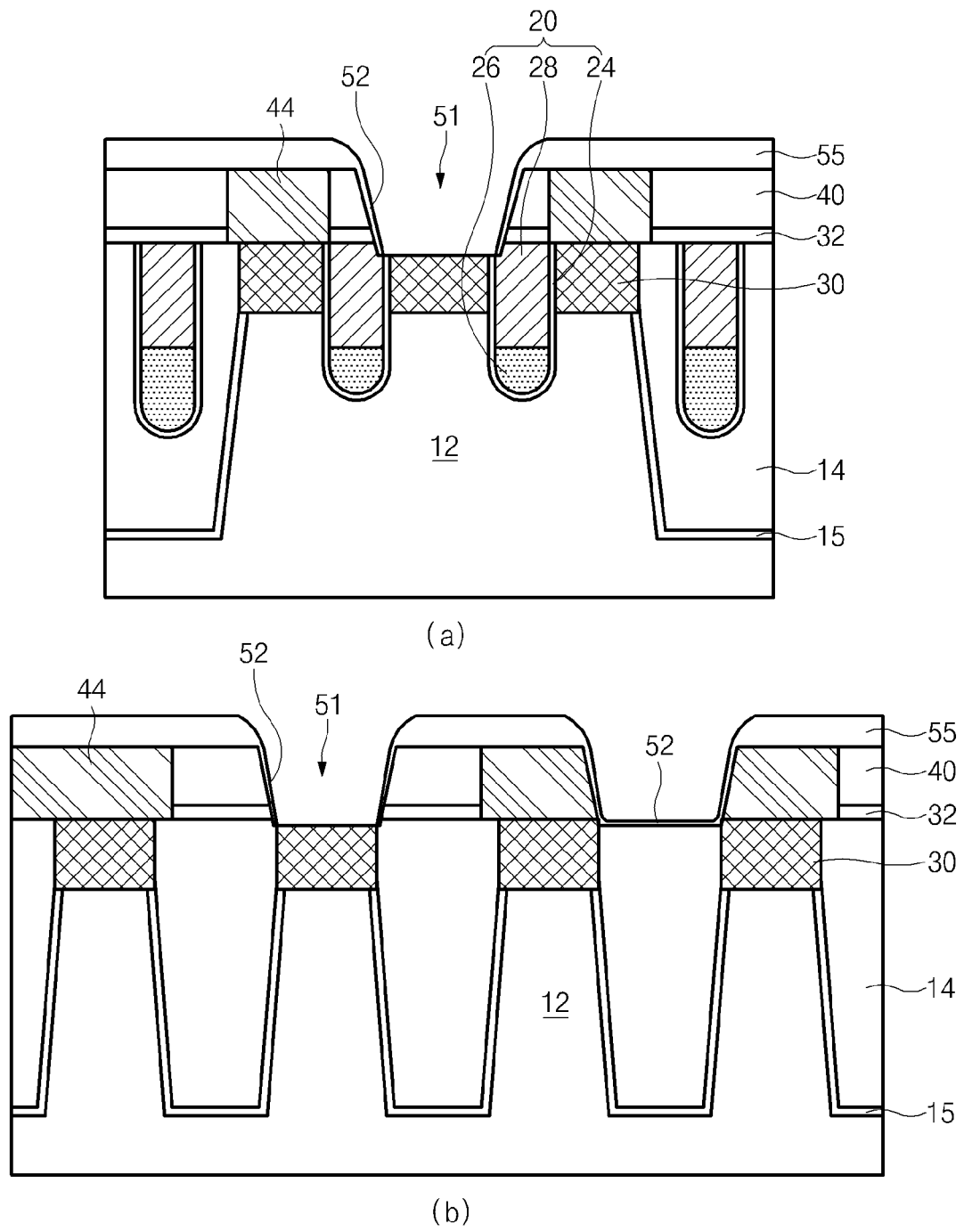

Referring next to FIG. 12, dielectric spacers 52 for insulating the bit-line groove 51 are formed on the bottom and side walls of the bit-line groove 51. This dielectric spacer 52 is preferably made of a material having a low dielectric constant, such as a nitride or oxide.

A contact mask (not shown) opens only a bit-line contact node portion (the left side bit-line groove 51 in FIG. 12(b)) where a bit-line contact is supposed to be formed so as to remove the dielectric spacer 52 on the bottom surface of the bit-line groove 51, thereby exposing the landing plug 30.

Figure 13:
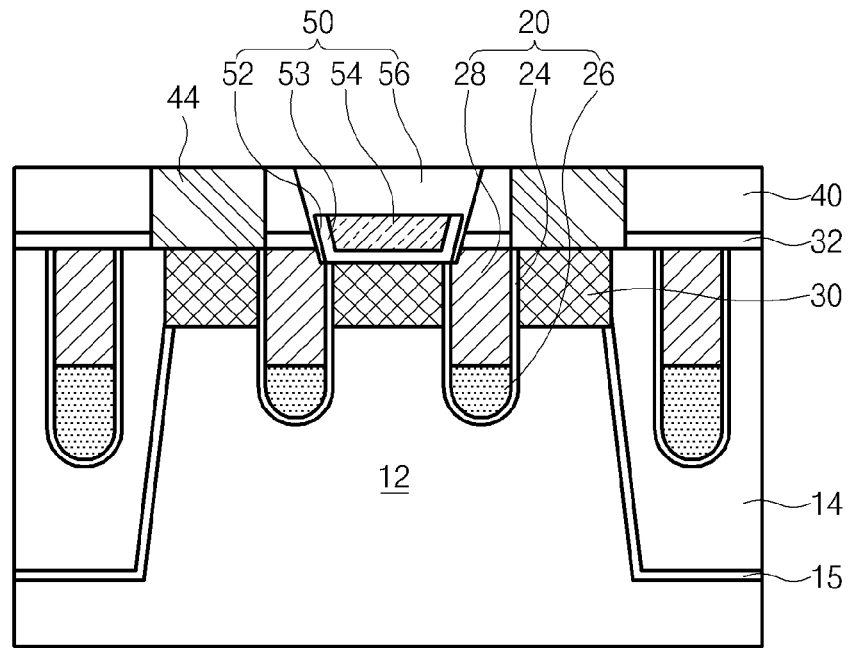
Figure 13:
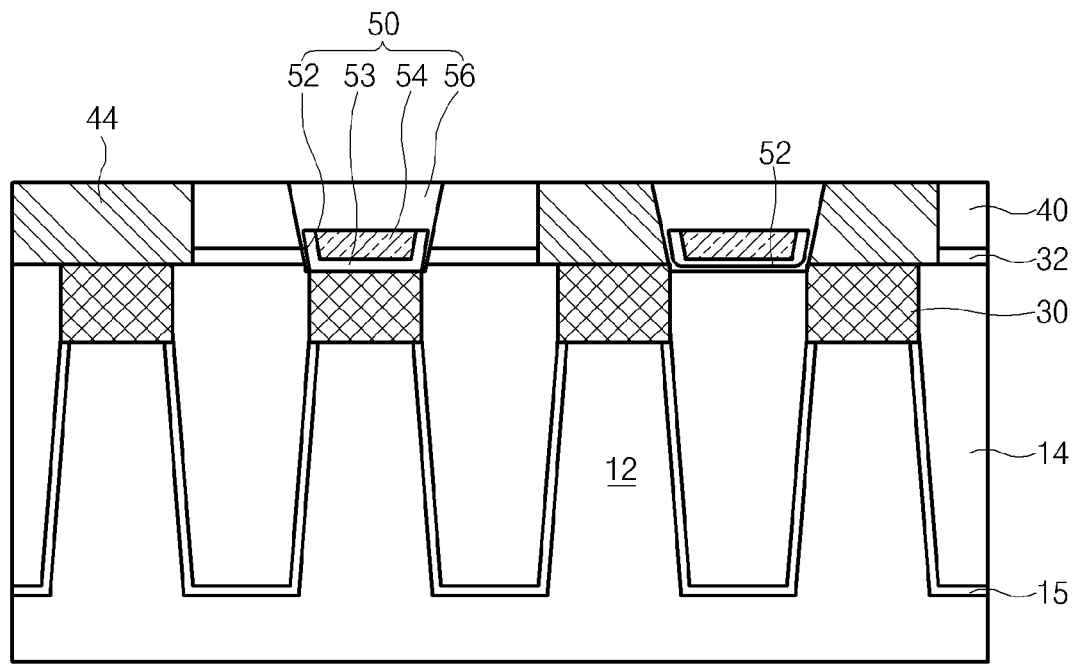

Referring to FIG. 13, bit lines 50 are formed in the bit-line grooves 51 having the dielectric spacer 52 formed thereon. To be more specific, a bit-line barrier metal layer 53 is formed first on the bottom and sidewall surfaces of the bit-line groove 51. The barrier metal layer 53 includes Ti/TiN or $Ti_xSi_x$ material in one embodiment.

In one embodiment, the barrier metal layer 53 is thermally treated for silicidification, where an interface region is converted to silicide while the bulk material (not shown) remains non-silicided. The upper portion is removed to leave the lower portion that has been converted to silicide remaining in the bit line groove 51. Since the portion where the bit-line contact is to be formed is free of the dielectric spacer 52, the bit lines are electrically connected with the landing plug 30.

A bit-line conductive layer 54 is formed over the surface of the barrier metal layer 53 (silicide in one embodiment), the bit-line conductive layer 54 may be made of tungsten (W). Meanwhile, to increase adhesion between the barrier metal layer 53 and the bit-line conductive layer 54, an adhesive layer or TiN layer (not shown) may additionally be formed on the interface between these two layers.

A bit-line hard mask 56 made of a nitride material is formed over the barrier metal layer 53 and bit-line conductive layer 54. The bit-line hard mask formation process includes depositing a nitride over the entire surface, and leaving the bit-line hard mask 56 only inside the bit-line groove 52 using CMP or etch-back.

Although subsequent processes are not shown, it should be understood that a capacitor consisting of a lower electrode, an upper electrode and a dielectric is formed over the storage node contact plug 44. Additional layers are formed thereover to complete the fabrication process of a semiconductor device.

The above embodiments of the present invention are illustrative and not limitative. Various alternatives and equivalents are possible. The invention is not limited by the embodiments described herein. Nor is the invention limited to any specific type of semiconductor device. Other additions, subtractions, or modification are obvious in view of the present disclosure and are intended to fall within the scope of the appended claims.

What is claimed is:

1. A method of fabricating a semiconductor device, comprising:
   forming a device isolation structure to define a plurality of active regions in a substrate, the plurality of the active regions including first and second active regions that are provided adjacent to each other;
   forming a plurality of buried word lines in the substrate, each buried word line being defined within a trench formed in the substrate;
   forming a storage node contact hole extending over the first and second active regions;
   filling the storage node contact hole with a storage node contact plug material;
   forming a bit-line groove to split the storage node contact plug material into first and second storage node contact plugs, the first storage node contact plug being assigned to the first active region and the second storage node contact plug being assigned to the second active region; and
   forming a bit line within the bit-line groove.

2. The method of claim 1, further comprising:
   forming a landing plug over the bit-line contact region and the storage node contact region.

3. The method of claim 2, wherein the formation of the landing plug comprises:
   forming a hard mask oxide and a hard mask layer over the surface of the first and second active regions before forming the buried word lines;
   removing the hard mask layer and the hard mask oxide from the surface of the first and second active regions after forming the buried word lines; and
   forming the landing plug in a space defined by the removal of the hard mask layer.

4. The method of claim 3, further comprising:
   implanting ions into the landing plug.

5. The method of claim 2, wherein the formation of the storage node contact hole comprises:
   forming an interlayer dielectric over the substrate including the landing plug and the word lines; and
   etching the interlayer dielectric using the landing plug as an etch stop layer.

6. The method of claim 2, wherein the surface of the landing plug has substantially the same height as the surface of the device isolation structure.

7. The method of claim 1, further comprising:
   forming a selective epi growth (SEG) layer in the bit-line contact and storage node contact regions of the first and second active regions.

8. The method of claim 1, wherein the formation of the buried word lines comprises:
   forming a plurality of trenches in the substrate;
   filling the trenches with a gate conductive layer; and
   forming a capping layer over the gate conductive layer within the trenches.

9. The method of claim 1, further comprising:
   forming a nitride spacer on a bottom and side surfaces of the bit-line groove; and
   removing the nitride spacer from the bottom of the bit-line groove in a portion of the bit-line contact node portion.

10. The method of claim 1, wherein the formation of the bit lines comprises:
    forming a barrier metal layer on the side walls and bottom surface of the bit-line groove; and
    forming a bit-line conductive layer over the surface of the barrier metal layer.

11. The method of claim 10, further comprising:
    thermally treating the barrier metal layer to convert a portion of the barrier metal layer into silicide; and
    removing the barrier metal layer that was not converted to silicide, thereby leaving the silicide within the bit line groove.

* * * * *